(12) United States Patent
Arao et al.

(10) Patent No.: US 7,763,500 B2
(45) Date of Patent: Jul. 27, 2010

(54) METHOD FOR MANUFACTURING SEMICONDUCTOR STORAGE DEVICE COMPRISING A SLOW COOLING STEP

(75) Inventors: Takashi Arao, Tokyo (JP); Kenichi Koyanagi, Tokyo (JP); Kenji Komeda, Tokyo (JP); Naruhiko Nakanishi, Tokyo (JP); Hideki Gomi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 670 days.

(21) Appl. No.: 11/498,129

(22) Filed: Aug. 3, 2006

(65) Prior Publication Data

US 2007/0032034 A1 Feb. 8, 2007

(30) Foreign Application Priority Data

Aug. 5, 2005 (JP) ............................. 2005-227685
Feb. 16, 2006 (JP) ............................. 2006-039138

(51) Int. Cl.
*H01L 21/335* (2006.01)
*H01L 21/8232* (2006.01)

(52) U.S. Cl. .................. 438/143; 438/386; 438/471; 438/472; 438/473; 438/474; 438/475; 438/476; 438/58; 438/402

(58) Field of Classification Search ........... 438/386, 438/471–476, 58, 143, 402
See application file for complete search history.

(56) References Cited

U.S. PATENT DOCUMENTS

| | | | | |
|---|---|---|---|---|
| 6,572,991 B1 * | 6/2003 | Ruppi | ........................ | 428/699 |
| 7,037,730 B2 * | 5/2006 | Basceri et al. | ................. | 438/3 |
| 7,396,719 B2 * | 7/2008 | Kim et al. | .................... | 438/240 |
| 2004/0157391 A1 * | 8/2004 | Park et al. | .................... | 438/250 |
| 2004/0266126 A1 * | 12/2004 | Lee | ............................. | 438/396 |
| 2004/0266217 A1 | 12/2004 | Kim et al. | | |
| 2005/0164445 A1 * | 7/2005 | Lin et al. | .................... | 438/240 |

FOREIGN PATENT DOCUMENTS

| | | | |
|---|---|---|---|
| JP | 07335656 A | * | 12/1995 |
| JP | 2000-31401 | | 1/2000 |
| JP | 2001-036031 | | 2/2001 |
| JP | 2002-094015 | | 3/2002 |
| JP | 2003-115548 | | 4/2003 |
| JP | 2004-063964 | | 2/2004 |

OTHER PUBLICATIONS

Partial English translation of Chinese Office Action mailed Nov. 9, 2007.
Chinese Office Action, with English translation, issued in Chinese Patent Application No. 095128129, dated Jan. 29, 2010.

* cited by examiner

*Primary Examiner*—Kenneth A Parker
*Assistant Examiner*—David Z Chen
(74) *Attorney, Agent, or Firm*—McDermott Will & Emery LLP

(57) ABSTRACT

First, a base structure provided with the main parts of a memory cell is prepared, and a lower electrode comprising a polycrystalline silicon film is thereafter formed on the base structure. Next, the surface of the lower electrode is thermally nitrided at a predetermined temperature to form a silicon nitride film. In the thermal nitridation of the lower electrode, the temperature is increased to a predetermined nitriding temperature, after which the temperature is reduced at a rate that is more gradual than usual. Aluminum oxide ($Al_2O_3$) or another metal oxide dielectric film is thereafter formed as the capacitive insulating film on the lower electrode, and an upper electrode is formed on the capacitive insulating film.

17 Claims, 12 Drawing Sheets

METHOD FOR MANUFACTURING SEMICONDUCTOR STORAGE DEVICE COMPRISING A SLOW COOLING STEP

TECHNICAL FIELD

The present invention relates to a method for manufacturing a semiconductor storage device, and more particularly relates to a method of manufacturing a semiconductor storage device in which a metal oxide dielectric film is used as a capacitive insulating film.

BACKGROUND OF THE INVENTION

In a DRAM (Dynamic Random Access Memory), tantalum oxide (TaO) or another metal oxide dielectric substance is preferably used as the material of the capacitive insulating film of a cell capacitor. Described below is a conventional method of forming a cell capacitor for a DRAM in which such a capacitive insulating film is used.

First, a lower electrode made of polycrystalline silicon is formed on the surface of a base structure on which cell transistors have been formed. Hemispherical silicon grains (HSG) have preferably been formed on the surface of the lower electrode in this case (see Japanese Patent Laid-open No. 2004-063964). An oxidation-preventing silicon nitride film ($Si_3N_4$) is then formed on the surface of the lower electrode by subjecting the base structure to rapid thermal nitridation (RTN) in an ammonia ($NH_3$) gas atmosphere at about 650° C. or higher, or in a plasma-activated ammonia ($NH_3$) gas atmosphere (see Japanese Patent Laid-open No. 2003-115548).

Non-crystalline tantalum oxide acting as the capacitive insulating film is subsequently deposited by CVD (see Japanese Patent Laid-open No. 2001-036031). Intermediate annealing is then carried out to improve the quality of the non-crystalline tantalum oxide film, after which high-temperature annealing is performed to crystallize the non-crystalline tantalum oxide film. An upper electrode comprising titanium nitride (TiN) is lastly formed on the capacitive insulating film.

In addition to tantalum oxide (TaO), also known as capacitive insulating films for DRAM are aluminum oxide ($Al_2O_3$), hafnium oxide ($HfO_2$), and other metal oxide dielectric substances (see Japanese Patent Laid-open No. 2002-094015). These substances have been particularly noteworthy in recent years because of their excellent compatibility with polycrystalline silicon electrode films, which serve as the lower electrode, in comparison with tantalum oxide (TaO).

There is a problem with the above-described conventional manufacture of a cell capacitor for a DRAM in that the frequent heat treatments activate the heavy metals in the silicon substrate, the impurities that affect the destruction of junctions, and other contaminants, and the refresh characteristics are therefore adversely affected by an increase in junction leaks. In order to solve this problem, it is possible to consider a method whereby a slow cooling process is added for the purpose of gettering after the formation of cell capacitors in which tantalum oxide (TaO) is used as a capacitive insulating film. However, this approach is liable to lead not only to a reduction in manufacturing efficiency due to increased labor, but also to a reduction in the quality of the capacitive insulating film comprising tantalum oxide (TaO).

In view of the above, it is possible to focus on the fact that high-temperature annealing must be performed in order to crystallize the film after the non-crystalline oxide tantalum film has been formed in cases in which tantalum oxide (TaO) is used as the capacitive insulating film, and to consider a method whereby contaminants are gettered by carrying out a slow cooling process during the high-temperature annealing step.

When, however, aluminum oxide ($Al_2O_3$) and hafnium oxide ($HfO_2$) are used as the capacitive insulating film, high-temperature annealing is not required to crystallize the film as is the case of tantalum oxide (TaO), the heating temperature during film formation is not exceedingly high at about 450° C., and the procedure directly advances to the upper electrode formation step after the capacitive insulating film has been formed. Therefore, a problem is encountered in that there is no opportunity to carry out a slow cooling process after the capacitive insulating film has been formed.

SUMMARY OF THE INVENTION

Therefore, an object of the present invention is to provide a method of manufacturing a semiconductor storage device that adequately reduces leaks from junctions and leaks from the capacitive insulating film, and that has good refresh characteristics even if metal oxides such as aluminum oxide and hafnium oxide are used for the capacitive insulating film.

The above-described object of the present invention is achieved by a method of manufacturing a semiconductor storage device that comprises at least the steps of forming a lower electrode on a base structure on which the main parts of the memory cell are formed, heat treating the lower electrode at a predetermined temperature, forming a capacitive insulating film on the lower electrode, and forming an upper electrode on the capacitive insulating film, wherein the step for heat treating the lower electrode includes a step for slowly cooling after heating to the predetermined temperature.

As used herein, the term "slow cooling" refers to reducing the temperature more gradually than normal after heating. More specifically, under normal circumstances, the furnace temperature is preferably reduced as rapidly as possible with consideration given to the cooling capacity of the high-temperature furnace and other conditions in order to improve the manufacturing efficiency by reducing the time required to complete a step. However, in the present invention, the temperature is not reduced as rapidly as possible, but is gradually reduced at a rate that allows the gettering effect to take place. The lower electrode is thereby heat-treated and gettered at substantially the same time.

In the present invention, the temperature reduction rate during slow cooling is preferably 3° C./minute or less. This is due to the fact that an excellent gettering effect can be obtained if the temperature reduction rate is within this range.

In the present invention, the lower electrode may be polycrystalline silicon, and may be a metal or a metal compound. In the case that the lower electrode is polycrystalline silicon, the step for heat treating the lower electrode is preferably a step for thermally nitriding the polycrystalline silicon.

In the present invention, the predetermined temperature for heat treating the lower electrode is preferably 600° C. or higher. Depletion of the lower electrode can thereby be reduced.

In the present invention, the capacitive insulating film is preferably a single-layer film that comprises aluminum oxide ($Al_2O_3$), or preferably a multilayer film comprising aluminum oxide ($Al_2O_3$) and hafnium oxide ($HfO_2$). These substances have a high dielectric constant and good compatibility with the polycrystalline silicon film. In the particular case of a single-layer film comprising aluminum oxide ($Al_2O_3$), film formation is relatively simple, and if the film is a multilayer film comprising aluminum oxide ($Al_2O_3$) and hafnium oxide ($HfO_2$), the dielectric constant of the capacitive insulating film can be further increased.

In the present invention, the step for heat treating the lower electrode is preferably carried out using a high-temperature furnace that can simultaneously heat a plurality of base structures. It is thereby possible to solve the problem of reduced manufacturing efficiency (throughput) caused by incorporating a slow cooling process during the lower electrode heat treatment step, and a heating means that is well-suited for long heat treatments can be provided.

Also, the above-described object of the present invention can be achieved by a method of manufacturing a semiconductor storage device provided with a step for forming a lower electrode, a step for forming a capacitive insulating film on the lower electrode, and a step for forming an upper electrode on the capacitive insulating film, wherein the step for forming the capacitive insulating film comprises a first step for forming a first insulating film, and a second step for forming a second insulating film comprising a different material than the first insulating film, the method further comprising a heating/slow cooling step for performing slow cooling after heating to a predetermined temperature between the step for forming a lower electrode and the second step.

In the present invention, a gettering effect can be obtained in this step because a heating/slow cooling step that follows heating to a predetermined temperature is added between the step for forming a lower electrode and the second step. Furthermore, since the heating/slow cooling step is carried out prior to the second step, it is possible for the second insulating film formed in the second step to be composed of hafnium oxide or another material with a high dielectric constant which crystallizes at a relatively low temperature and in which leaks are normally increased by crystallization.

In this case, the heating/slow cooling step may be carried out between the step for forming the lower electrode and the first step, or may be carried out between the first and second steps. The former approach makes it possible to avoid an increase in labor because slow cooling can be carried out in the step for nitriding polycrystalline silicon, which is the lower electrode material. The latter approach makes it possible to improve the quality of the first insulating film formed in the first step and to reduce leaks because heat treatment is carried out between the first and second steps.

Thus, in accordance with one aspect of the present invention, contaminants activated by repeated heat treatments can be gettered because a slow cooling process is carried out during the heat treatment step of the lower electrode. In particular, a separate independent slow cooling process for gettering is not required, and a reduction in the quality of the capacitive insulating film and diffusion of contaminants does not occur. This is because a step for heat treating the capacitive insulating film at a crystallization temperature of the film or higher is not required after its formation. Therefore, leaks from junctions and leaks from the capacitive insulating film can be adequately reduced, and a semiconductor storage device with excellent refresh characteristics can be manufactured.

In accordance with another aspect of the present invention, contaminants can be efficiently gettered even when the capacitive insulating film comprises at least two insulating films.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
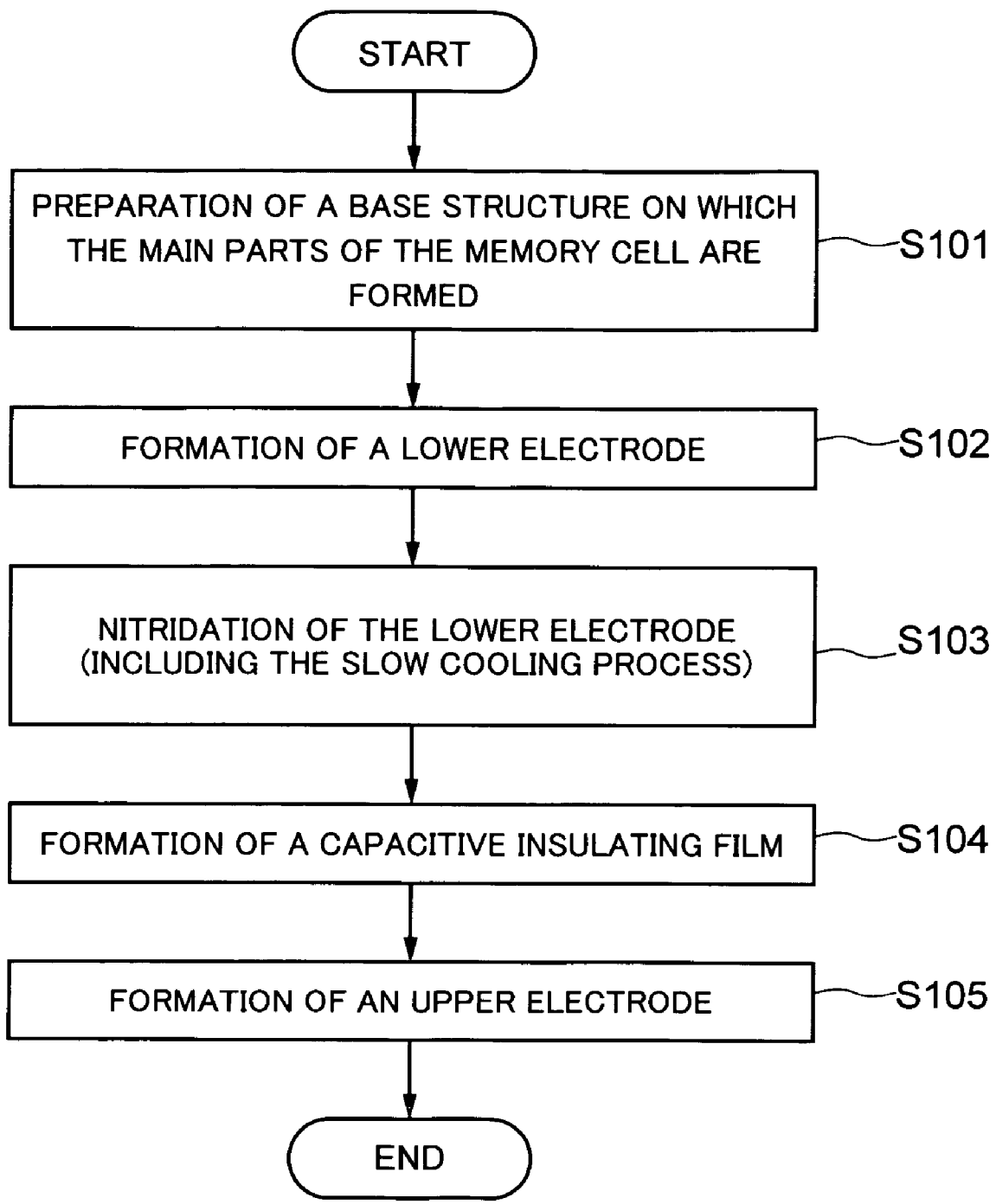
FIG. 1 is a flowchart showing the process of forming a cell capacitor for a DRAM according to the first preferred embodiment of the present invention.

FIG. 1 is a part of the manufacturing process of a semiconductor storage device, and is a flowchart showing the process of forming a cell capacitor for a DRAM according to the first preferred embodiment of the present invention. FIGS. 2 to 5 are cross-sectional views schematically showing configurations of a base structure obtained by using the steps shown in FIG. 1.

Figure 2:
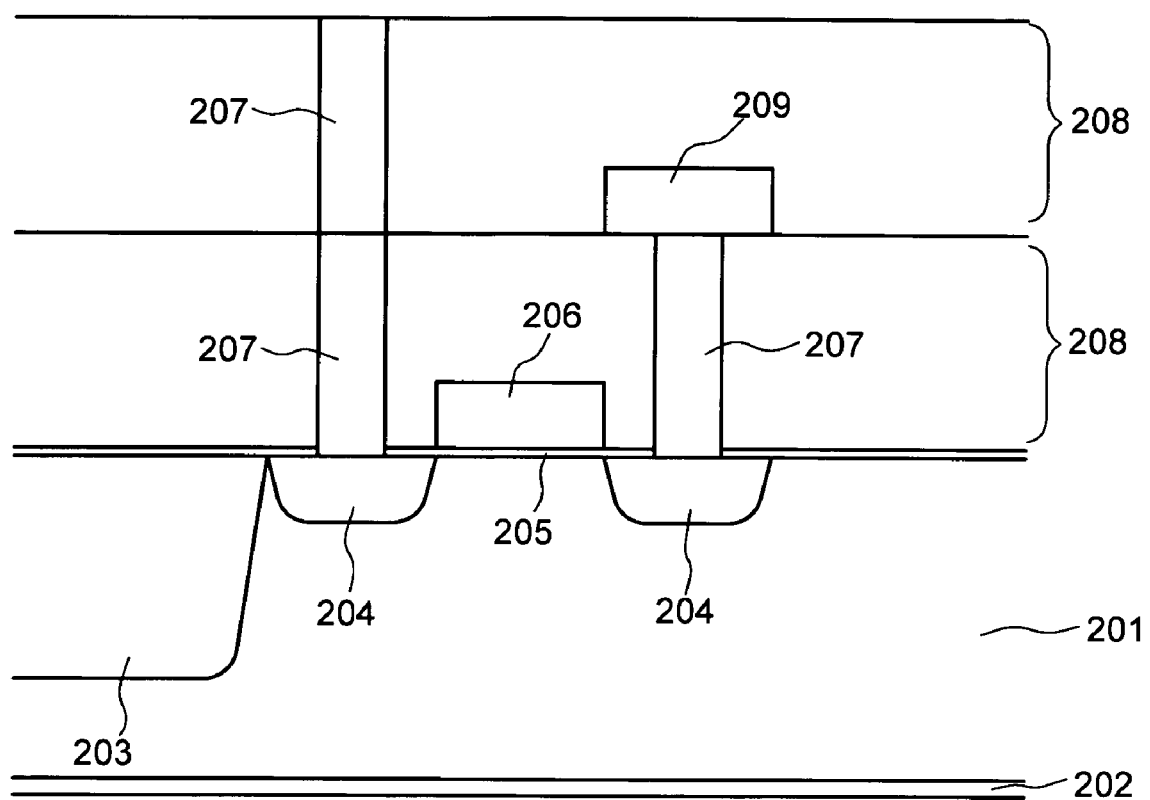
FIG. 2 is a cross-sectional view that schematically shows the configuration of the base structure.

Prepared first in the formation of the cell capacitor according to the present embodiment is a base structure 200 on which the main parts of the memory cell of a DRAM are formed (step S101). As shown in FIG. 2, the main part of the memory cell of the present embodiment comprises a p-type silicon substrate 201, a polycrystalline silicon layer 202 that acts as a getter site disposed in the vicinity of the back surface of the p-type silicon substrate 201, an STI (Shallow Trench Isolation) 203 formed inside the p-type silicon substrate 201, an n-type diffusion region 204 that is the source/drain of the cell transistors, a gate insulation film 205 formed on the p-type silicon substrate 201, a gate electrode 206 that is a word line formed on the gate insulation film 205, a contact plug 207 for electrically connecting the layers, an interlayer insulating film 208, and a bit line 209 composed of tungsten or another high-melting metal. The n-type diffusion region 204, gate insulating film 205, and gate electrode 206 make up a cell transistor.

Figure 3:
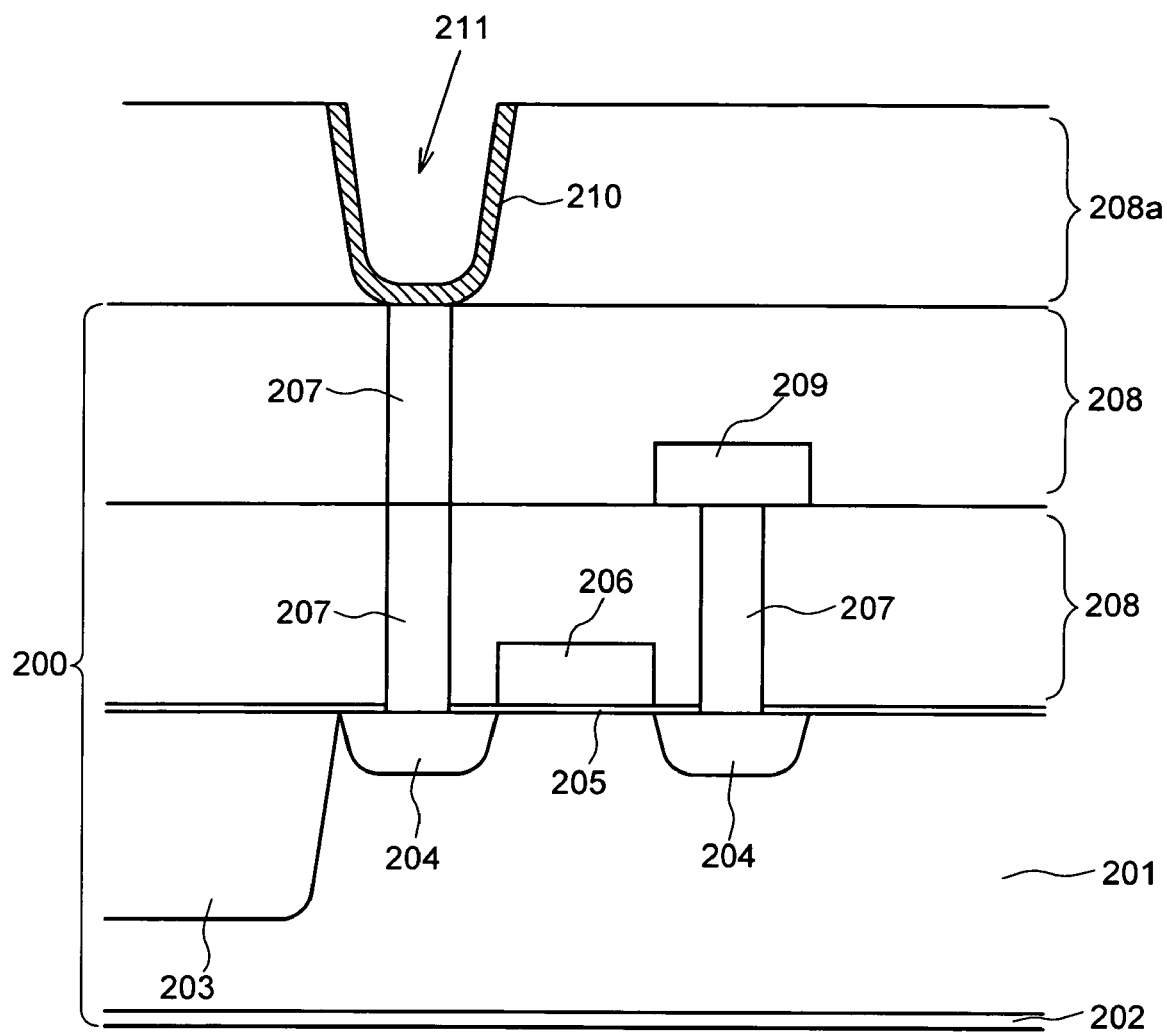
FIG. 3 is a cross-sectional view that schematically shows the configuration of a base structure obtained by using the formation step of the lower electrode.

In the first step for forming a cell capacitor on such a base structure 200, a lower electrode 210 is formed on the base structure 200 (step S102), as shown in FIG. 3. In order to make the electrode surface area as large as possible, an interlayer insulating film 208a is formed on the base structure 200 together with a deep cell capacitor hole 211, and the lower electrode 210 is formed on the inside surface of the deep cell capacitor hole 211.

The cell capacitor of the present embodiment is an MIS (Metal Insulator Silicon) capacitor, and polycrystalline silicon is used as the material of the lower electrode 210. In this step, a polycrystalline silicon film having a thickness of about 30 nm is formed by depositing polycrystalline silicon using the CVD method. Hemispherical silicon grains (HSG) are preferably formed on the surface of the polycrystalline silicon film in order to further increase the electrostatic capacitance. Also, the polycrystalline silicon is preferably doped with phosphorus or another n-type impurity. The lower electrode 210 formed in this manner is connected to the n-type diffusion region 204 by way of the contact plug 207.

Figure 4:
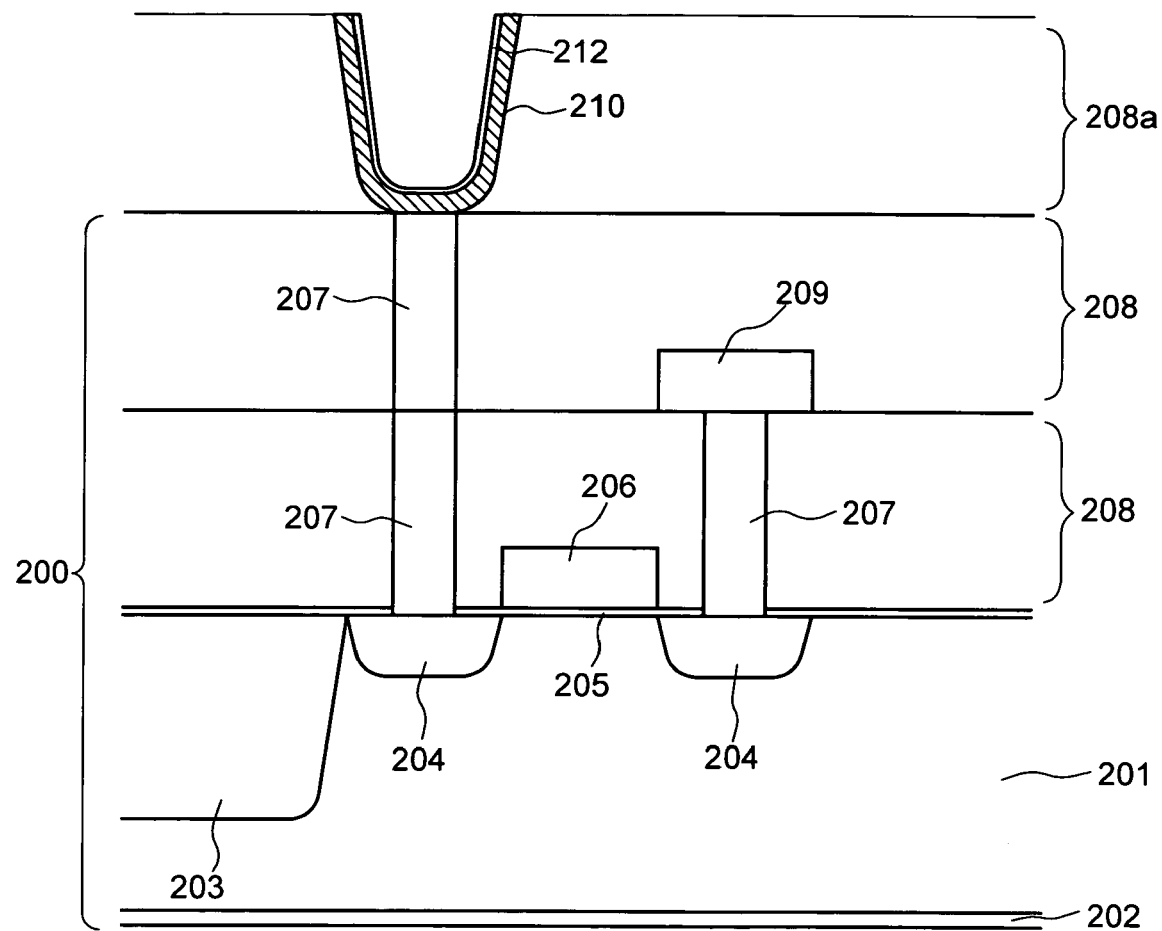
FIG. 4 is a cross-sectional view schematically showing a configuration of a base structure obtained by using the thermal nitridation step.

The next step is a thermal nitridation step for thermally nitriding the polycrystalline silicon film, which is the lower electrode 210, and forming a thin, oxidation-preventing silicon nitride film ($Si_3N_4$) 212 on the surface of the polycrystalline silicon film, as shown in FIG. 4 (step S103). This step is ordinarily carried out after the natural oxide film formed on the surface of the polycrystalline silicon film has been removed in advance by wet etching. The thermal nitridation step is performed in a high-temperature furnace, and the silicon nitride film ($Si_3N_4$) 212 is formed having a thickness of about 1 nm on the surface of the lower electrode 210 by exposing the base structure to an ammonia ($NH_3$) gas environment for about 1 minute at 600° C. or higher, and preferably 650° C. or higher. The reason for setting the temperature required for thermal nitridation to 600° C. or higher is that this temperature can reduce depletion of the lower electrode 210.

In this case, a slow cooling process for gettering is also carried out together with the thermal nitridation step. More specifically, when the base structure 200 has been nitrided in a high-temperature furnace and the furnace temperature is thereafter reduced, the furnace temperature is gradually reduced to a predetermined temperature over a period of time that is sufficiently longer than the heating time (about 1 minute) required for nitridation. The interior of the furnace during slow cooling may be allowed to remain as an ammonia gas atmosphere, or may be a nitrogen gas ($N_2$) atmosphere. The temperature reduction rate is preferably 3° C./minute or less, and is more preferably 1.5 to 3° C./minute. This is because a good gettering effect can be obtained if the temperature reduction rate is within the stated range.

A vertical furnace that can process a large number of base structures as a group (as a batch) is preferably used as the high-temperature furnace. In the case that, for example, a conventional RTP (Rapid Thermal Process) apparatus is adopted in the thermal nitridation step, a prescribed number of base structures can be sequentially treated in a prescribed amount of time even in a wafer process because rapid heating with a halogen lamp or the like and cooling can be carried out in the same step.

However, incorporating a slow cooling process into the thermal nitridation step is disadvantageous in that the thermal nitridation step does not progress well if the base structures are treated one at a time. This is because a single cycle of the thermal nitridation step requires a long period of time from start to finish. In view of this situation, the present embodiment solves such a problem by using a furnace as the heating means, and by particularly using a vertical furnace that can simultaneously treat a large number of base structures. The number of base structures that can be processed as a batch in a high-temperature furnace is preferably several tens or more, and more specifically 25 or more.

Figure 5:
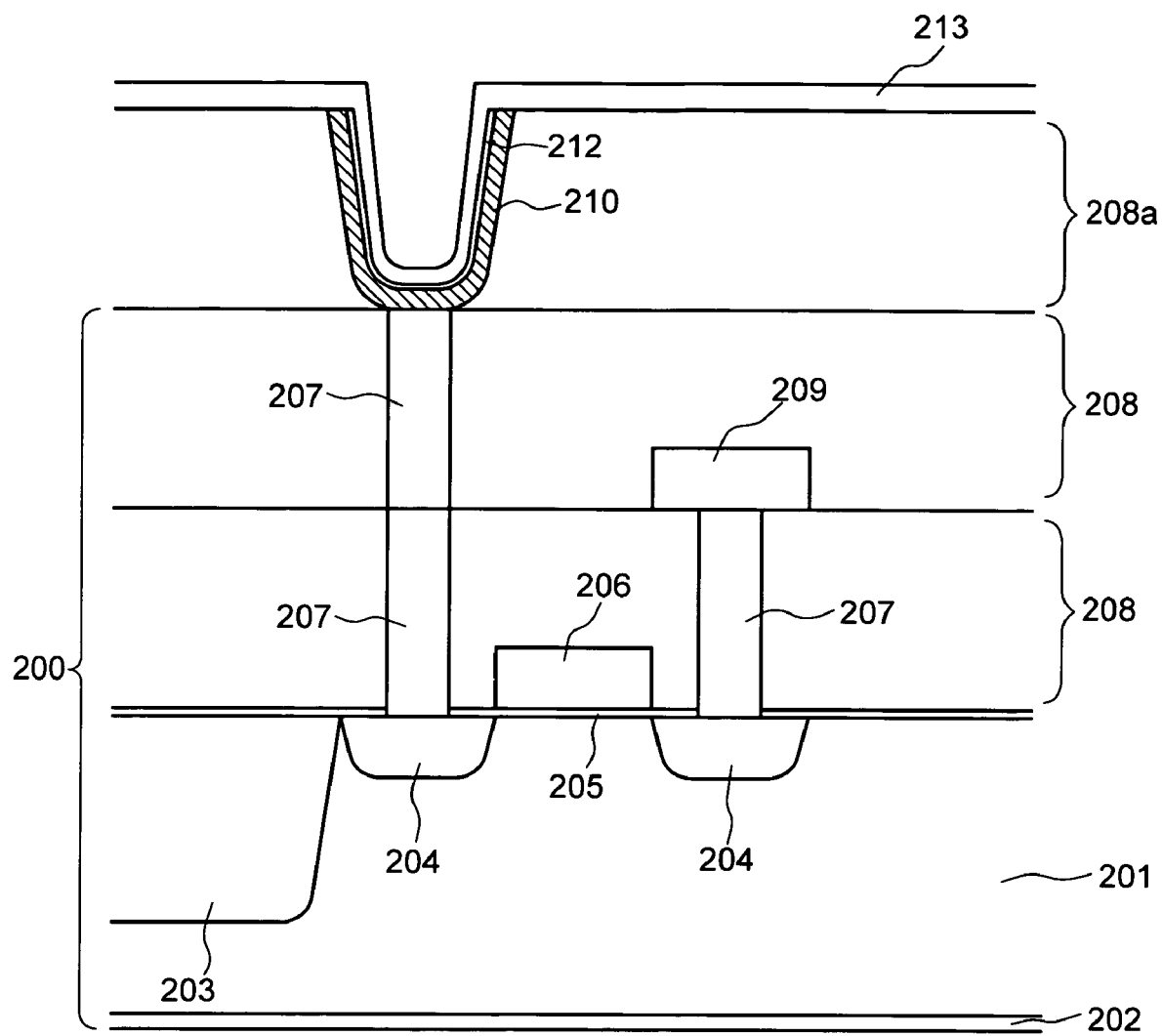
FIG. 5 is a cross-sectional view schematically showing a basic configuration obtained by using the formation step of the capacitive insulating film.

In the next step, a capacitive insulating film 213 is formed on the surface of the lower electrode 210 on which silicon nitride film ($Si_3N_4$) 212 has been formed, as shown in FIG. 5 (step S104). Aluminum oxide ($Al_2O_3$) and hafnium oxide ($HfO_2$) or other metal oxide dielectric films are used for the capacitive insulating film. In the case of forming a single-layer aluminum oxide film as the capacitive insulating film, TMA ($Al(CH_3)_3$: trimethyl aluminum) is used as the starting material gas, and an $Al_2O_3$ film having a thickness of about 6 nm is deposited by ALD (Atomic Layer Deposition) at a temperature of about 350 to 450° C. When the film is formed by ALD, the desired film thickness is achieved by repeating the film formation step several tens to several hundred times because a thickness of only 0.05 nm can be formed in a single cycle.

A multilayer film comprising aluminum oxide ($Al_2O_3$) and hafnium oxide ($HfO_2$) may be formed as the capacitive insulating film 213. The dielectric constant of the capacitive insulating film can thereby be made higher in comparison with a single-layer film composed of aluminum oxide ($Al_2O_3$) In this case, aluminum oxide is deposited by using ALD, and hafnium oxide ($HfO_2$) is deposited thereafter on the surface of the aluminum oxide also by using ALD. In this case, TEMAH ($Hf(N(CH_3)(C_2H_5))_4$: tetraethyl methyl amino hafnium) is used as the starting material gas, and a film is deposited at a temperature of about 250° C. A multilayer film composed of $Al_2O_3$ and $HfO_2$ is thereby formed to a total thickness of about 6 nm, wherein the thickness of the $Al_2O_3$ film and the $HfO_2$ film is 3 nm each, for example.

When tantalum oxide (TaO) is used as the metal oxide dielectric film, a non-crystalline tantalum oxide film is first formed, and the film must be crystallized by high-temperature annealing at about 780° C. to improve the dielectric constant of the TaO. However, such high-temperature annealing is not required when $Al_2O_3$ and $HfO_2$ are used. Therefore, steps that follow the formation of the capacitive insulating film do not activate heavy metals present in the vicinity of the junctions and do not activate impurities that destroy junctions.

Figure 6:
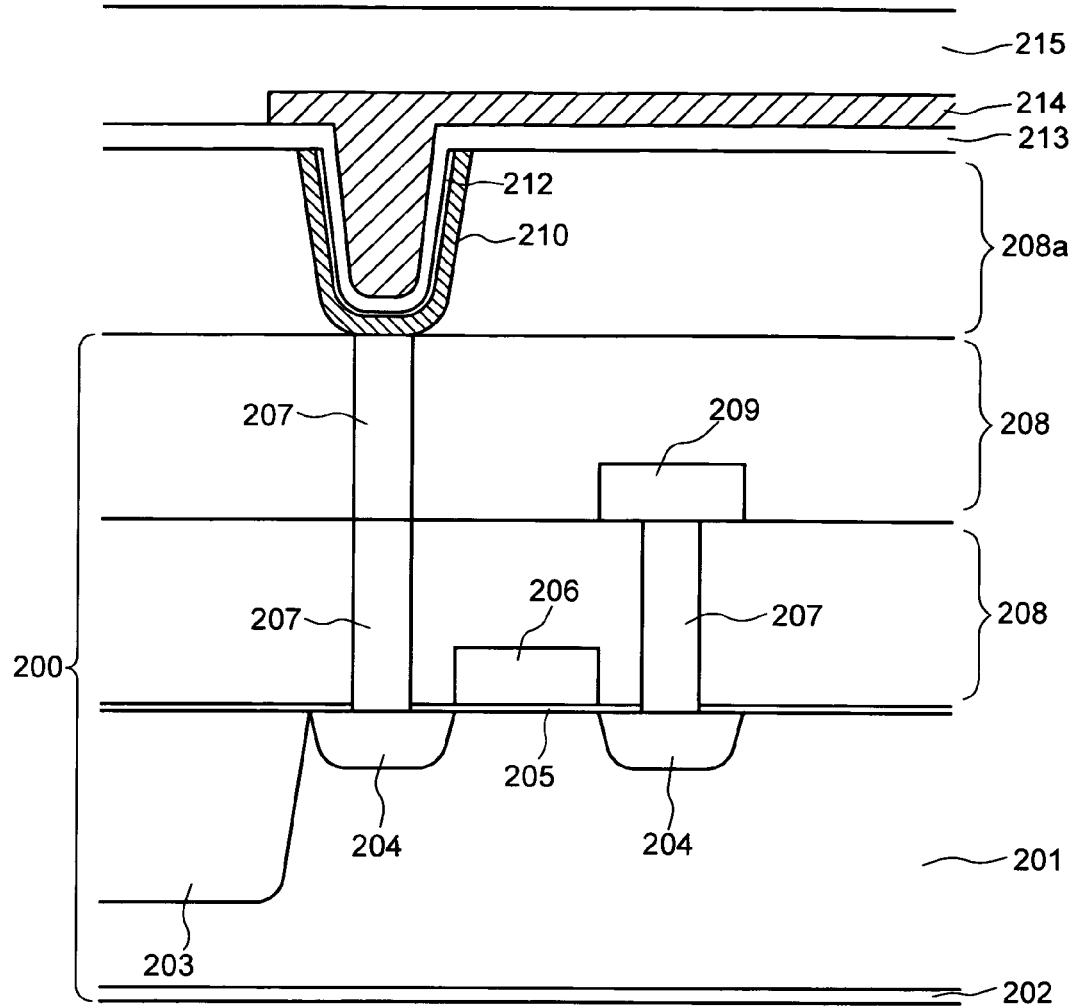
FIG. 6 is a cross-sectional view schematically showing a configuration of a base structure obtained by using the formation step of the upper electrode.

In the final step in the present embodiment, an upper electrode 214 is formed on the surface of the capacitive insulating film 213, as shown in FIG. 6. Titanium nitride (TiN), for example, is used as the upper electrode 214, and the titanium nitride (TiN) is deposited by CVD at a temperature of 500 to 550° C., after which the upper electrode 214 is formed by patterning the metal film using photolithography and etching. An interlayer insulating film 215 is then formed on the surface of the upper electrode 214 to end the series of manufacturing processes.

Figure 7:
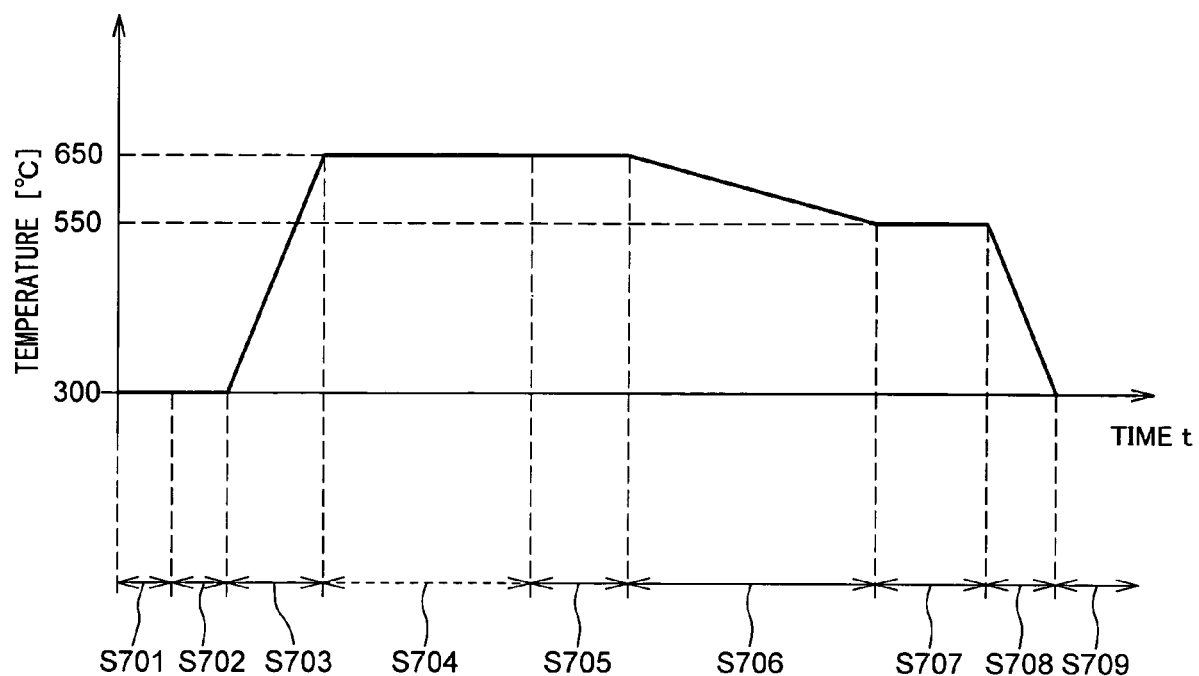
FIG. 7 is a sequence chart showing the details of the thermal nitridation step of the lower electrode.

FIG. 7 is a sequence chart showing the thermal nitridation step in greater detail.

In the thermal nitridation step, the base structure 200 is first loaded into a high-temperature furnace preheated to 300° C., as shown in FIG. 7 (S701). The preheat temperature inside the high-temperature furnace that varied due to the loading procedure is stabilized at 300° C. for a fixed period of time (S702), and the temperature inside the high-temperature furnace is then increased to 650° C. in a single operation (S703). At this point, the furnace is left standing for 10 minutes until the temperature stabilizes at 650° C. (S704). This is because the temperature inside the high-temperature furnace, after arriving at 650° C., gradually converges at the target temperature by repeatedly overshooting and undershooting.

The base structure 200 is exposed for about 1 minute to an ammonia atmosphere ($NH_3$) at 650° C. (S705) after which the slow cooling process is started (S706). In the slow cooling process, the base structure 200 is heated while the furnace temperature is reduced from 650° C. at a temperature reduction rate of 3° C./minute, for example. The high-temperature furnace is then purged with nitrogen (S707), and the interior of the high-temperature furnace is cooled to 300° C. (S708), after which the base structure 200 is removed (S709) and the thermal nitridation step is ended.

Thus, when a slow cooling process is incorporated in the thermal nitridation step, heavy metals in the vicinity of junctions or impurities that destroy junctions are activated, and these impurities can be made to be adsorbed by the polycrystalline silicon layer 202 comprising a large number of crystal defects and by the contact plug 207 composed of polycrystalline silicon. Therefore, junction leak current can be reduced and the refresh characteristics of the DRAM can be improved.

As described above, in accordance with the present embodiment, the slow cooling process is carried out during the thermal nitridation step of the lower electrode prior to the formation of the capacitive insulating film. Therefore, junction leak current can be reduced without degradation of the quality of the capacitive insulating film, and the refresh characteristics of the DRAM can be improved. The slow cooling process can also be carried out without a loss of throughput because a high-temperature furnace that allows a large number of base structures to be processed in a single batch can be used as the heating means in the thermal nitridation step.

The second preferred embodiment of the present invention is described next.

Figure 8:
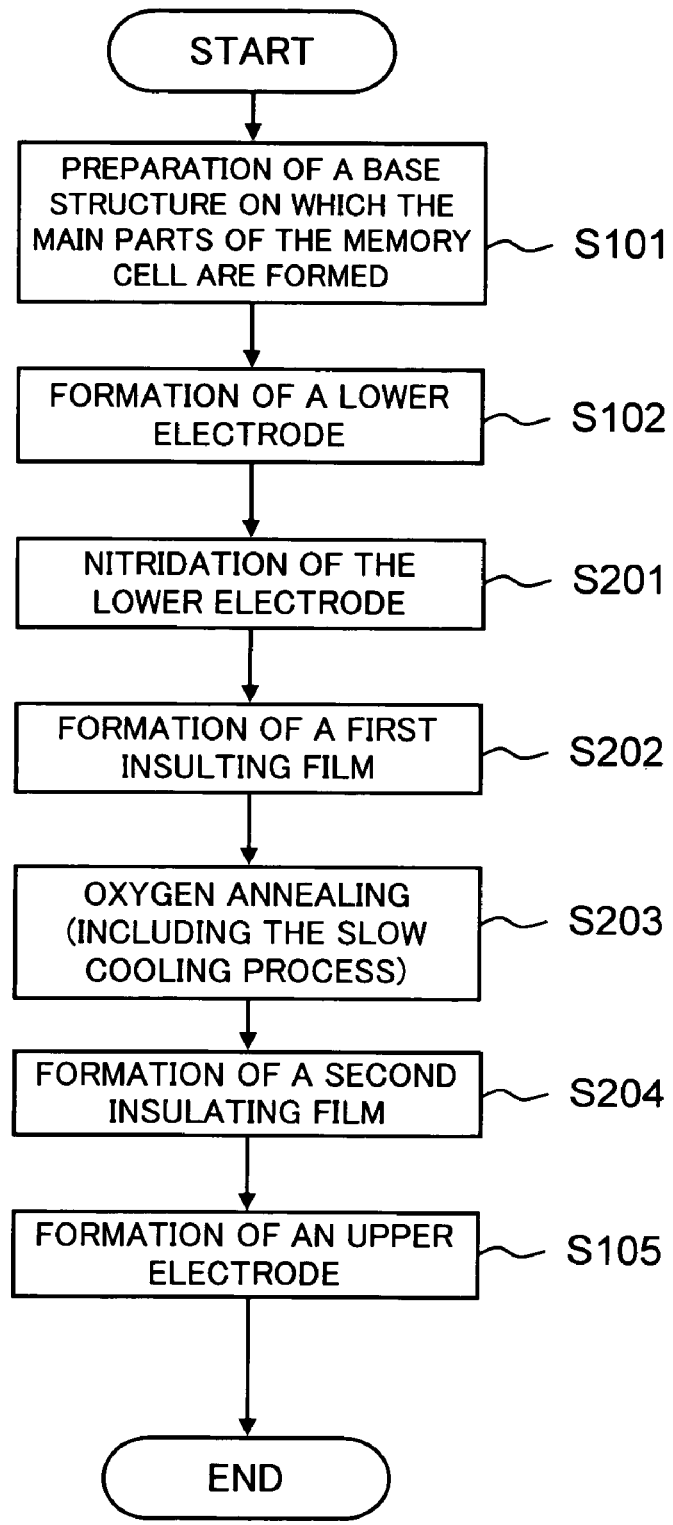
FIG. 8 is a flowchart showing the process of forming a cell capacitor for a DRAM according to the second preferred embodiment of the present invention.

FIG. 8 is a flowchart showing the process of forming a cell capacitor for a DRAM according to the second preferred embodiment of the present invention.

The present embodiment is the same process as the embodiment described above except that the steps following the completion of the lower electrode (step S102) to the step for forming the upper electrode (step S105) are different, as shown in FIG. 8.

First, a base structure 200 is prepared on which the main parts of the memory cell of a DRAM are formed (step S101), a lower electrode 210 is then formed on the base structure 200 (step S102), and the lower electrode 210 is subjected to thermal nitridation (step S210), as shown in FIGS. 2 and 3. In this step, a thin, oxidation-preventing silicon nitride film ($Si_3N_4$) 212 is formed by thermal nitridation on the surface of the polycrystalline silicon film, which is the lower electrode 210, as shown in FIG. 4.

In the present embodiment, however, the slow cooling process is not performed in the present step. More specifically, the temperature is reduced at a normal rate after the base structure 200 has been heated. Therefore, in contrast to the above-described embodiment, a gettering effect cannot be obtained in the present step. For this reason, a wafer-type RTP (Rapid Thermal Process) apparatus may be used in the present step.

Figure 9:
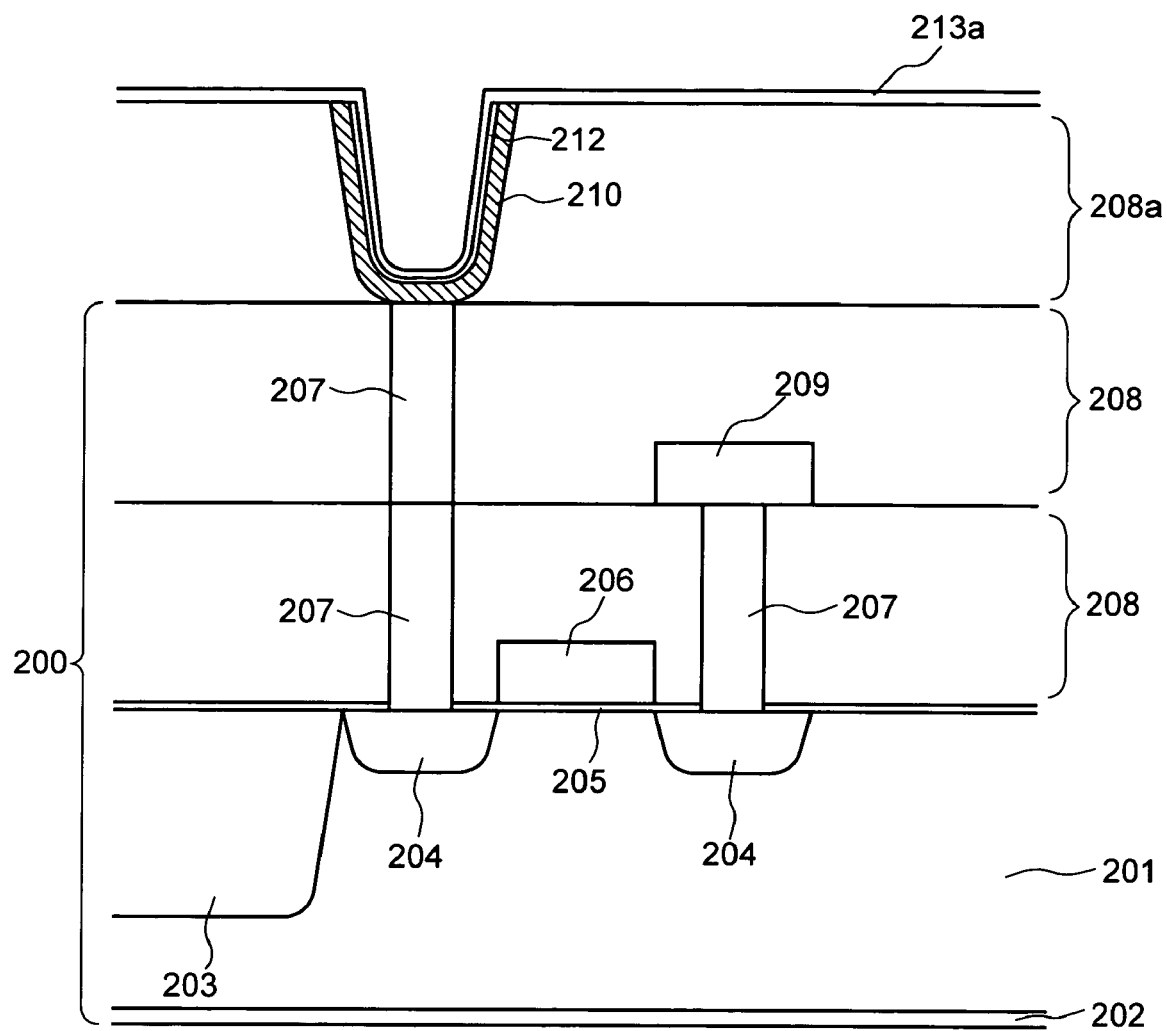
FIG. 9 is a cross-sectional view that schematically shows the configuration of a base structure obtained by using the formation step of the first capacitive insulating film.

In the next step, a first insulating film 213a, which is a portion of the capacitive insulating film, is formed on the surface of the lower electrode 210 on which the silicon nitride film 212 is formed (step S202), as shown in FIG. 9. Aluminum oxide ($Al_2O_3$) is preferably selected as the material of the first insulating film 213a. As described above, TMA ($Al(CH_3)_3$: trimethyl aluminum) may be used as the starting material gas in order to form aluminum oxide, and the film may be formed by ALD (Atomic Layer Deposition) at a temperature of about 350 to 450° C. A first insulating film 213a is thereby formed to a thickness of about 2 nm.

Oxygen annealing is subsequently carried out in order to improve the quality of the first insulating film 213a composed of aluminum oxide ($Al_2O_3$) (step S203). Oxygen annealing is carried out by heating the base structure to about 700° C., and exposing the base structure for about 5 minutes to an atmosphere containing oxygen gas ($O_2$). Defects in the aluminum oxide ($Al_2O_3$), which is the first insulating film 213a, are repaired and the quality of the film is improved. The thin, incomplete silicon oxide film that is unavoidably disposed between the silicon nitride film 212 and the first insulating film 213a is strengthened, and the reliability of the cell capacitor is improved.

In the present embodiment, a slow cooling process is carried out for the purpose of gettering. More specifically, when the base structure 200 is heated for oxygen annealing and the temperature of the furnace is then reduced, the temperature of the furnace is gradually reduced to a predetermined temperature over a period of time that is sufficiently longer than the heating time required for oxygen annealing (about 5 minutes). The interior of the furnace during slow cooling may be allowed to remain as an oxygen gas atmosphere, or may be a nitrogen gas ($N_2$) atmosphere. The temperature reduction rate is preferably 3° C./minute or less, and is more preferably 1.5 to 3° C./minute, in the same manner as in the embodiment described above. This is because a good gettering effect can be obtained if the temperature reduction rate is within the stated range.

A vertical furnace that is advantageous for the slow cooling process is preferably used as the high-temperature furnace in oxygen annealing. This is for the same reason that a vertical furnace that can simultaneously process a large number of base structures is preferably used in the thermal nitridation step in the above-described embodiment, rather than an RTP (Rapid Thermal Process) apparatus.

The heating temperature during oxygen annealing is equal to or greater than the temperature required for gettering, and the temperature must be set below the crystallization temperature of aluminum oxide ($Al_2O_3$), which is the material of the first insulating film 213a. This is due to the fact that when the temperature is set to or above the crystallization temperature (about 800° C.) of aluminum oxide ($Al_2O_3$), leaks increase because the aluminum oxide ($Al_2O_3$) crystallizes.

Figure 10:
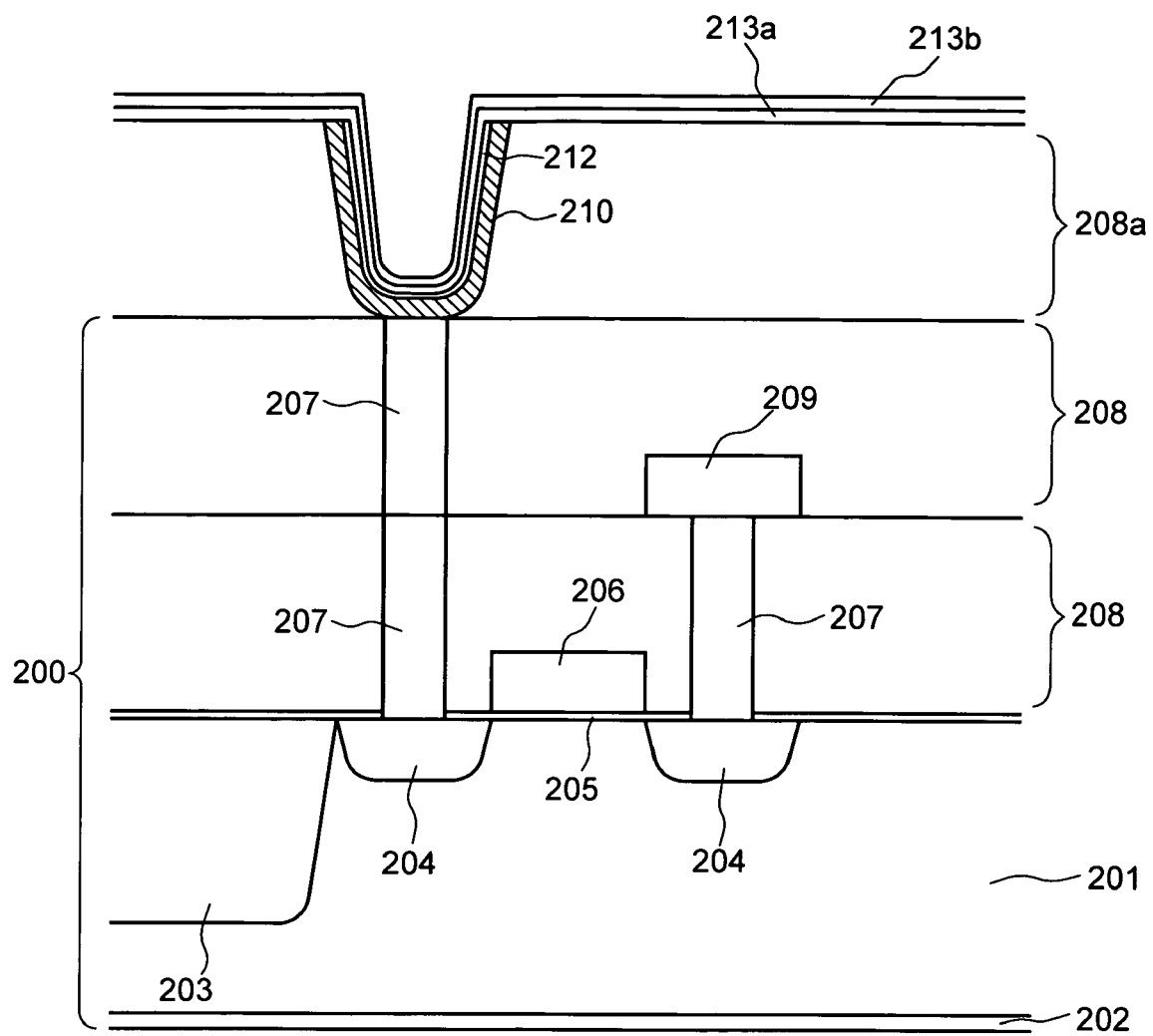
FIG. 10 is a cross-sectional view that schematically shows the configuration of a base structure obtained by using the formation step of the second capacitive insulating film.
Figure 11:
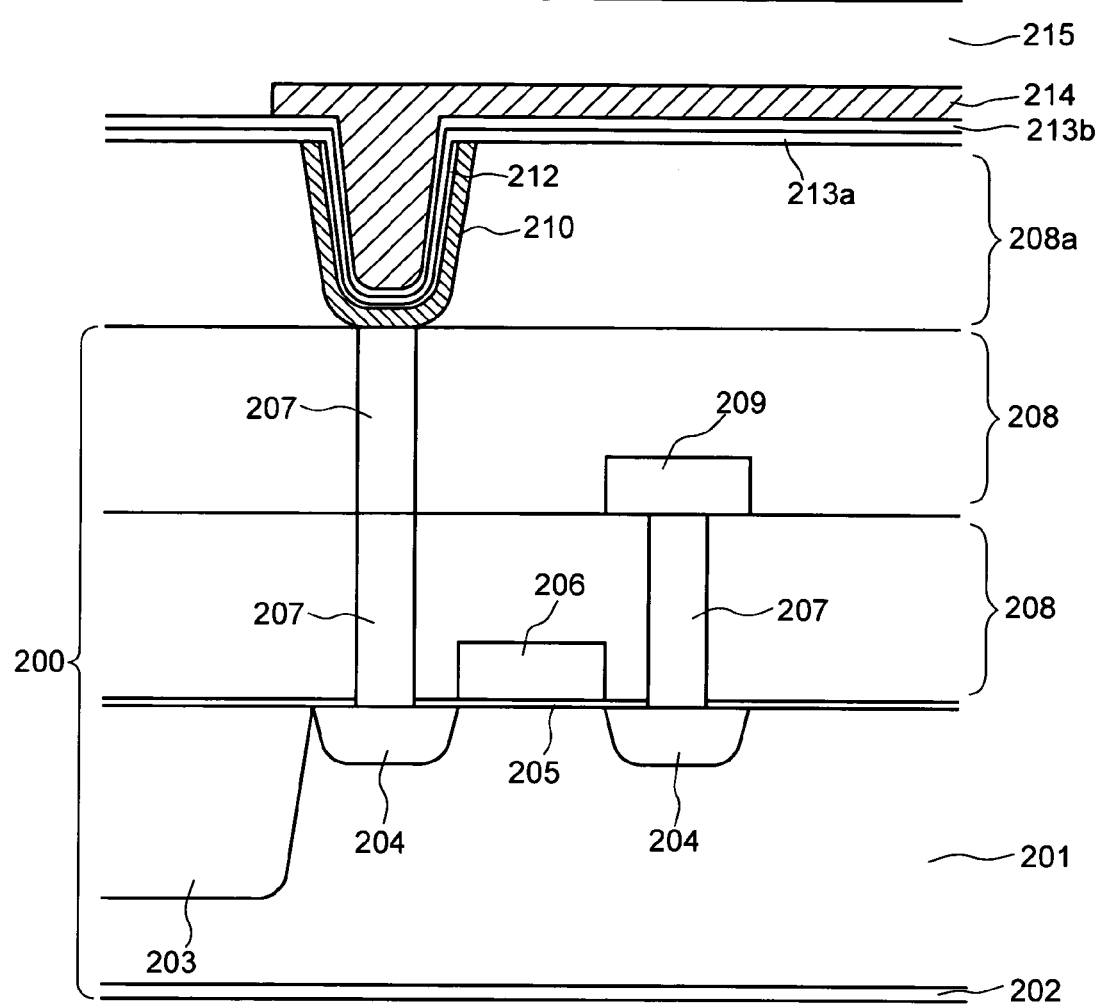
FIG. 11 is a cross-sectional view schematically showing a configuration of a base structure obtained by using the formation step of the upper electrode.

In the next step, a second insulating film 213b, which is a portion of the remainder of the capacitive insulating film, is formed on the surface of the first insulating film 213a (step S204), as shown in FIG. 10. Hafnium oxide ($HfO_2$) is preferably selected as the material of the second insulating film 213b. As described above, TEMAH ($Hf(N(CH_3)(C_2H_5))_4$: tetraethyl methyl amino hafnium) may be used as the starting material gas in order to form hafnium oxide, and a film may be deposited at a temperature of about 250° C. using ALD (Atomic Layer Deposition). A second insulating film 213b is thereby formed to a thickness of about 2 nm.

Hafnium oxide ($HfO_2$) crystallizes at about 500° C., which is a lower temperature than the crystallization temperature of aluminum oxide ($Al_2O_3$). Since hafnium oxide ($HfO_2$) also has a characteristic whereby leaks increase due to crystallization, a heat treatment step cannot be carried out for the purpose of gettering after the hafnium oxide ($HfO_2$) has been formed. In the present embodiment, however, a gettering effect can be obtained without crystallization of the hafnium oxide ($HfO_2$) because a heating/slow cooling step (step S203) that doubles as oxygen annealing is performed after the formation of an aluminum oxide ($Al_2O_3$) film, which has a relatively high crystallization temperature, and prior to the formation of a hafnium oxide ($HfO_2$) film, which has a relatively low crystallization temperature.

The first and second insulating films 213a and 213b formed in this manner correspond to the capacitive insulating film 213 in the above-described embodiment.

The remaining steps are carried out in the same manner as in the above-described embodiment, wherein an upper electrode 214 is formed on the surface of the capacitive insulating film 213 (step S105), and an interlayer insulating film 215 is formed on the upper electrode 214 to complete the series of manufacturing processes, as shown in FIG.

As described above, in the present embodiment, a high dielectric constant can be maintained while leaks are reduced because a laminate composed of first and second insulating films 213a and 213b is used as the capacitive insulating film 213. Also, a gettering effect can be produced by the heating/slow cooling step while a material with a high dielectric constant and a low crystallization temperature, such as hafnium oxide ($HfO_2$), is used as the material of the second insulating film 213b. This is because the heating/slow cooling step (step S203) that doubles as oxygen annealing is carried out after the formation of the first insulating film 213a and prior to the formation of the second insulating film 213b.

The present invention is in no way limited to the aforementioned embodiments, but rather various modifications are possible within the scope of the invention as recited in the claims, and naturally these modifications are included within the scope of the invention.

In the first embodiment described above, for example, a case was described in which a slow cooling process was carried out in the thermal nitridation step of the polycrystalline silicon film, which is the lower electrode of an MIS capacitor, but the present invention is not limited to this configuration, and the slow cooling process can be carried out in the heat treatment step of the lower electrode of a MIM (Metal Insulator Metal) capacitor. When titanium nitride (TiN) is adopted as the lower electrode, a heat treatment is sometimes carried out in an ammonia gas environment after film formation in order to ensure a more compact film, and the slow cooling process can be carried out during the heat treatment step. The present invention in not limited to titanium nitride as the lower electrode of the MIM capacitor, and tungsten nitride (WN) or another metal film may be used.

Also, in the second embodiment described above, the capacitor has an MIS structure, but when an MIM structure is adopted, annealing may be carried out in an atmosphere of nitrogen gas ($N_2$) and argon gas (Ar) in place of oxygen annealing, and slow cooling can be carried out thereafter.

Furthermore, in the second embodiment described above, aluminum oxide ($Al_2O_3$) was used as the material of the first insulating film 213a, but another material may be used as long as the material does not crystallize at the temperature required for gettering. Aluminum oxide ($Al_2O_3$), as described in the second embodiment, is the best example of such a material.

EXAMPLE

First, aluminum oxide ($Al_2O_3$) was used as a capacitive insulating film to prepare 600 units of DRAM memory cell sample #1 that had been slowly cooled during the thermal nitridation of the polycrystalline silicon film, which is the lower electrode. Following this is the manufacturing procedure of the DRAM memory cell sample #1.

First, a deep cell capacitor hole was formed in the base structure on which the main part of the above-described memory cell was formed, and a lower electrode was formed in the inside surface of the hole. A polycrystalline silicon film having HSG was formed as the lower electrode. The base structure was exposed for 1 minute in an ammonia atmosphere at 650° C. to form a thin nitride film to a thickness of 1 nm on the surface of the polycrystalline silicon film, and a slow cooling process was thereafter carried out for the purpose of gettering.

In the slow cooling process, the temperature reduction rate was set to 3° C./minute, and the slow cooling time was 1 hour and 20 minutes. A single-layer film composed of aluminum oxide was subsequently formed by ALD to a thickness of 6 nm as the capacitive insulating film, and a titanium nitride film was thereafter formed by CVD to a thickness of 30 nm as the upper electrode.

As a comparative example, DRAM memory cell sample #2 manufactured under the same conditions as DRAM memory cell sample #1 was prepared in the same number of units as the DRAM memory cell sample #1, except that the slow cooling process was not carried out during the thermal nitridation step.

Next, the ability of DRAM memory cell samples #1 and #2 to retain "1" as information was measured. The ability of a DRAM memory cell to retain "1" as information shows the amount of time that has elapsed when the "1" is lost after the information has been written to the cell. In other words, the results show the refresh characteristics of the DRAM memory cell.

Figure 12:
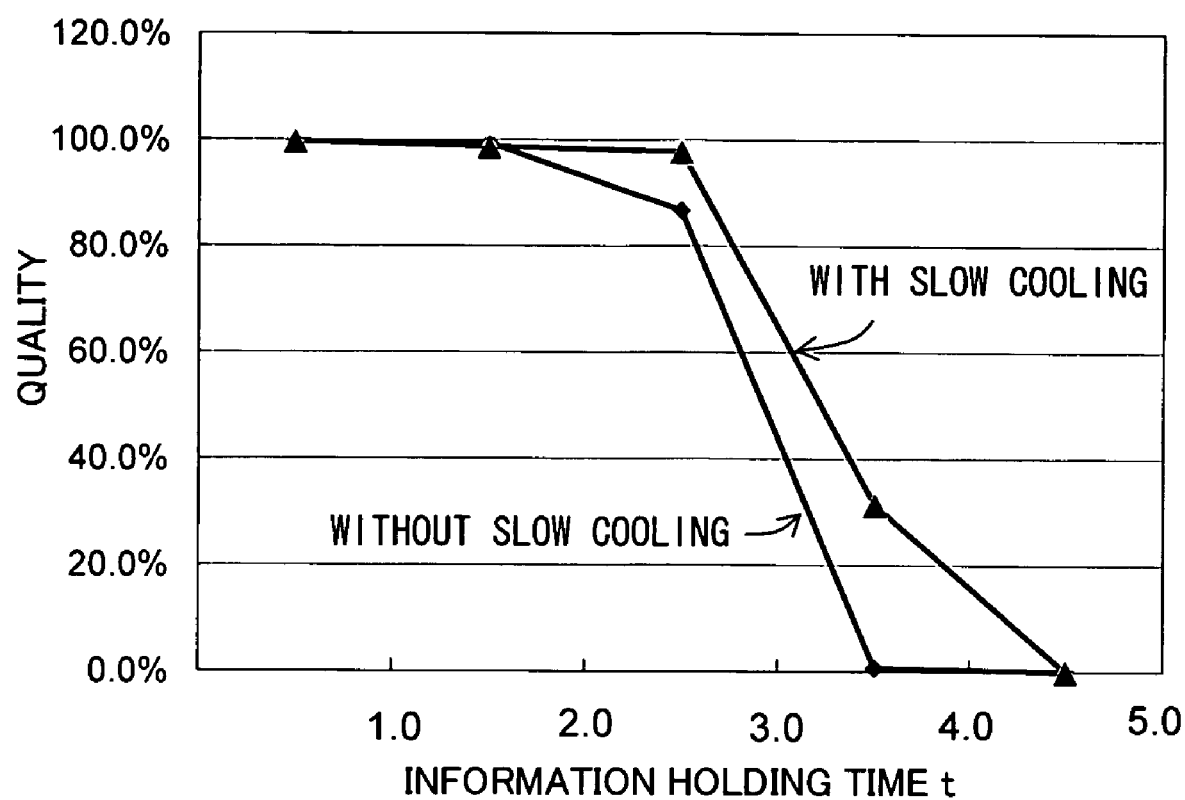
FIG. 12 is a graph showing the results of measuring the ability (tREF characteristic) of DRAM memory cells to retain "1" as information.

FIG. 12 is a graph showing the results of measuring the ability (tREF characteristic) of DRAM memory cell samples #1 and #2 to retain "1" information. In the graph, the horizontal axis is the information holding time t (this reflects normalized time rather than actual time), and the vertical axis is the yield (%) of the DRAM memory cell sample.

It is apparent from FIG. 12 that the yield of the sample that satisfied the condition t=0.5 was 100%, and both samples #1 and #2 satisfied the condition t=0.5. As the tREF condition was gradually made more stringent, the yield of each of samples #1 and #2 became 0% when t=4.5 was reached. In sample #2, which had not undergone the slow cooling process, the yield was about 90% at t=2.5, and the yield was substantially 0% at t=3.5.

In contrast, in sample #1, which was subjected to slow cooling during thermal nitridation, the yield was about 96% at t=2.5, and about 21% at t =3.5. From the measurement results described above, it is apparent that, in comparison with the case in which a slow cooling process is not carried out, the ability of a cell to retain information is better when a slow cooling process is carried out during the thermal nitridation step.

What is claimed is:

1. A method of manufacturing a semiconductor storage device, comprising:

a step for forming a lower electrode on a base structure on which main parts of a memory cell are formed;

a step for heat treating the lower electrode at a temperature of 600° C. or higher;

a step for forming a capacitive insulating film on the lower electrode; and a step for forming an upper electrode on the capacitive insulating film, wherein the step for heat treating the lower electrode occurs before forming the upper electrode and includes a step for slowly cooling at a temperature reduction rate of 3° C./minute or less from the temperature of 600° C. or higher, and during the step for slowly cooling at a temperature reduction rate of 3° C./minute or less the temperature is reduced to about 550° C.

2. The method of manufacturing the semiconductor storage device as claimed in claim 1, wherein the lower electrode includes polycrystalline silicon, the step for heat treating the lower electrode is a step for thermally nitriding the polycrystalline silicon.

3. The method of manufacturing the semiconductor storage device as claimed in claim 1, wherein the lower electrode is made of metal or a metal compound.

4. The method of manufacturing the semiconductor storage device as claimed in claim 1, wherein the capacitive insulating film includes aluminum oxide ($Al_2O_3$).

5. The method of manufacturing the semiconductor storage device as claimed in claim 4, wherein the capacitive insulating film includes a multilayer film having aluminum oxide ($Al_2O_3$) and hafnium oxide ($HfO_2$).

6. The method of manufacturing the semiconductor storage device as claimed in claim 1, wherein the step for heat treating the lower electrode is carried out using a high-temperature furnace that can simultaneously heat a plurality of base structures.

7. A method of manufacturing a semiconductor storage device, comprising:
a step for forming a lower electrode;
a step for forming a capacitive insulating film on the lower electrode; and
a step for forming an upper electrode on the capacitive insulating film,
wherein the step for forming the capacitive insulating film includes a first step for forming a first insulating film and a second step for forming a second insulating film made of a different material than the first insulating film,
the method further comprising a heating/slow cooling step of heating to a temperature of 600° C. or higher and then cooling from the temperature of 600° C. or higher at a temperature reduction rate of 3° C./minute or less between the step for forming a lower electrode and the second step,
wherein during the cooling from the temperature of 600° C. or higher at a temperature reduction rate of 3° C./minute or less the temperature is reduced to about 550° C.

8. The method of manufacturing the semiconductor storage device as claimed in claim 7, wherein a crystallization temperature of the second insulating film is lower than that of the first insulating film.

9. The method of manufacturing the semiconductor storage device as claimed in claim 8, wherein the first insulating film includes aluminum oxide ($Al_2O_3$) and the second insulating film includes hafnium oxide ($HfO_2$).

10. The method of manufacturing the semiconductor storage device as claimed in claim 8, wherein the temperature of 600° C. or higher is lower than the crystallization temperature of the first insulating film and higher than the crystallization temperature of the second insulating film.

11. The method of manufacturing the semiconductor storage device as claimed in claim 7, wherein the heating/slow cooling step is carried out between the step for forming the lower electrode and the first step.

12. The method of manufacturing the semiconductor storage device as claimed in claim 7, wherein the heating/slow cooling step is carried out between the first and second steps.

13. The method of manufacturing the semiconductor storage device as claimed in claim 12, further comprising a step for heat treating the lower electrode at a predetermined temperature after the step for forming the lower electrode and before the first step.

14. The method of manufacturing the semiconductor storage device as claimed in claim 13, wherein the lower electrode includes polycrystalline silicon, the step for heat treating the lower electrode is a step for thermally nitriding the polycrystalline silicon.

15. A method of manufacturing a semiconductor storage device, comprising:
a step for forming a lower electrode;
a first heat treating step for heat treating the lower electrode;
a step for forming a first insulating film on the lower electrode;
a second heat treating step for heat treating the first insulating film at a temperature of 600° C. or higher;
a step for forming a second insulating film on the first insulating film after the second heat treating step;
a step for forming an upper electrode on the second insulating film,
wherein a cooling period in the second heat treating step is performed at a temperature reduction rate of 3° C./minute or less from the temperature of 600° C. or higher and is longer than a cooling period in the first heat treating step, and during the cooling period in the second heat treating step performed at a temperature reduction rate of 3° C./minute or less from the temperature of 600° C. or higher the temperature is reduced to about 550° C.

16. The method of manufacturing the semiconductor storage device as claimed in claim 15, wherein the first insulating film includes aluminum oxide ($Al_2O_3$) and the second insulating film includes hafnium oxide ($HfO_2$).

17. The method of manufacturing the semiconductor storage device as claimed in claim 15, wherein a heat temperature in the second heat treating step is lower than a crystallization temperature of the first insulating film and higher than a crystallization temperature of the second insulating film.

* * * * *